United States Patent
Uno et al.

(10) Patent No.: US 8,507,160 B2
(45) Date of Patent: Aug. 13, 2013

(54) FLARE PREDICTION METHOD, PHOTOMASK MANUFACTURING METHOD, SEMICONDUCTOR DEVICE MANUFACTURING METHOD, AND COMPUTER-READABLE MEDIUM

(75) Inventors: Taiga Uno, Yokohama (JP); Yukiyasu Arisawa, Tsukuba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 63 days.

(21) Appl. No.: 13/233,680

(22) Filed: Sep. 15, 2011

(65) Prior Publication Data

US 2012/0202140 A1 Aug. 9, 2012

(30) Foreign Application Priority Data

Feb. 4, 2011 (JP) .................................. 2011-023019

(51) Int. Cl.
*G03F 9/00* (2006.01)
(52) U.S. Cl.
USPC .............................................. 430/30; 716/51

(58) Field of Classification Search
USPC .............................................. 430/30; 716/51
See application file for complete search history.

(56) References Cited

U.S. PATENT DOCUMENTS

| | | | |
|---|---|---|---|
| 6,625,802 B2 | 9/2003 | Singh et al. | |
| 6,898,781 B2 | 5/2005 | Singh et al. | |
| 7,234,130 B2 | 6/2007 | Word et al. | |
| 8,039,177 B2 * | 10/2011 | Uno et al. | 430/5 |
| 8,227,151 B2 * | 7/2012 | Inanami et al. | 430/5 |

FOREIGN PATENT DOCUMENTS

JP 2010-80511 4/2010

* cited by examiner

*Primary Examiner* — Christopher Young
(74) *Attorney, Agent, or Firm* — Finnegan, Henderson, Farabow, Garrett & Dunner, LLP (57) ABSTRACT

According to one embodiment, a flare prediction method in photolithography includes determining a pattern density distribution of a pattern layout, determining an inclination of a variation in the pattern density distribution, and performing a flare calculation in a plurality of partition sizes based on the inclination of a variation in the pattern density distribution.

11 Claims, 6 Drawing Sheets

FLARE PREDICTION METHOD, PHOTOMASK MANUFACTURING METHOD, SEMICONDUCTOR DEVICE MANUFACTURING METHOD, AND COMPUTER-READABLE MEDIUM

CROSS-REFERENCE TO RELATED APPLICATIONS

This application is based upon and claims the benefit of priority from prior Japanese Patent Application No. 2011-023019, filed Feb. 4, 2011, the entire contents of which are incorporated herein by reference.

FIELD

Embodiments described herein relate generally to a flare prediction method, a photomask manufacturing method, a semiconductor device manufacturing method, and a computer-readable medium.

BACKGROUND

As semiconductor devices are being miniaturized further, use of extreme ultraviolet (EUV) light in photolithography is under consideration. In EUV exposure, a reflecting optical system and a reflective photomask are used.

The surface of a mirror of the reflecting optical system cannot be made completely flat, permitting a roughness in the mirror surface. Therefore, exposure light reflects diffusely at the mirror surface. The diffusely reflected exposure light is also applied to a region which should normally be unexposed on the semiconductor wafer surface (or photoresist surface). The exposure light diffusely reflected and applied to the wafer surface is called flare.

When flare has occurred, the contrast of exposure light decreases and a desired resist pattern cannot be formed. The amount of flare depends on a surrounding pattern density. Therefore, the following problem arises: even if patterns are the same in design size, patterns differing in size according to a variation in the surrounding pattern density are formed on a semiconductor wafer.

To prevent the problem, it is important to predict a flare distribution in advance and perform correction. A flare distribution is predicted as follows.

First, a pattern layout (or design layout) is partitioned into a plurality of regions in mesh form. A pattern density is calculated for each of the partitioned regions to make a density map. Then, the convolution of a point spread function (PSF) and the density map is calculated to produce a flare map (or a flare distribution).

However, the flare map made as described above has only one flare value for each partitioned region (or each mesh). Therefore, when flare has changed significantly in a mesh, a flare value cannot be determined with high accuracy. To determine a high-accuracy flare distribution, it is necessary to make a partition size (or a mesh size) smaller. When the partition size is made smaller, the computation time increases significantly. For example, the length of one side of a mesh is halved, the calculation amount to determine flare values for all the meshes represents a 16-fold increase.

As described above, the conventional art has the problem of requiring an enormous computation time to predict flare with high accuracy.

DETAILED DESCRIPTION

In general, according to one embodiment, a flare prediction method in photolithography includes determining a pattern density distribution of a pattern layout; determining an inclination of a variation in the pattern density distribution; and performing a flare calculation in a plurality of partition sizes based on the inclination of a variation in the pattern density distribution.

Hereinafter, referring to the accompanying drawings, an embodiment will be explained. In the embodiment, an explanation will be given on the assumption that extreme ultraviolet (EUV) light is used as exposure light for photolithography, a reflecting optical system is used as an optical system, and a reflecting photomask is used as a photomask.

Figure 1:
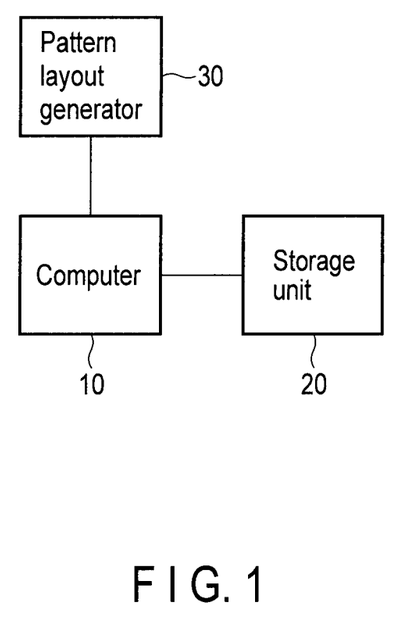
FIG. 1 is a block diagram schematically showing a system for implementing a flare prediction method according to an embodiment.

FIG. 1 is a block diagram schematically showing a system for implementing a flare prediction method according to the embodiment.

The system shown in FIG. 1 comprises a computer 10, a storage unit 20, and a pattern layout generator 30.

The computer 10 performs arithmetic processing to predict flare in photolithography. The storage unit 20 stores the result of arithmetic processing performed by the computer 10. The pattern layout generator 30 generates a pattern layout (or design layout) of a semiconductor device (or semiconductor integrated circuit device).

Figure 2:
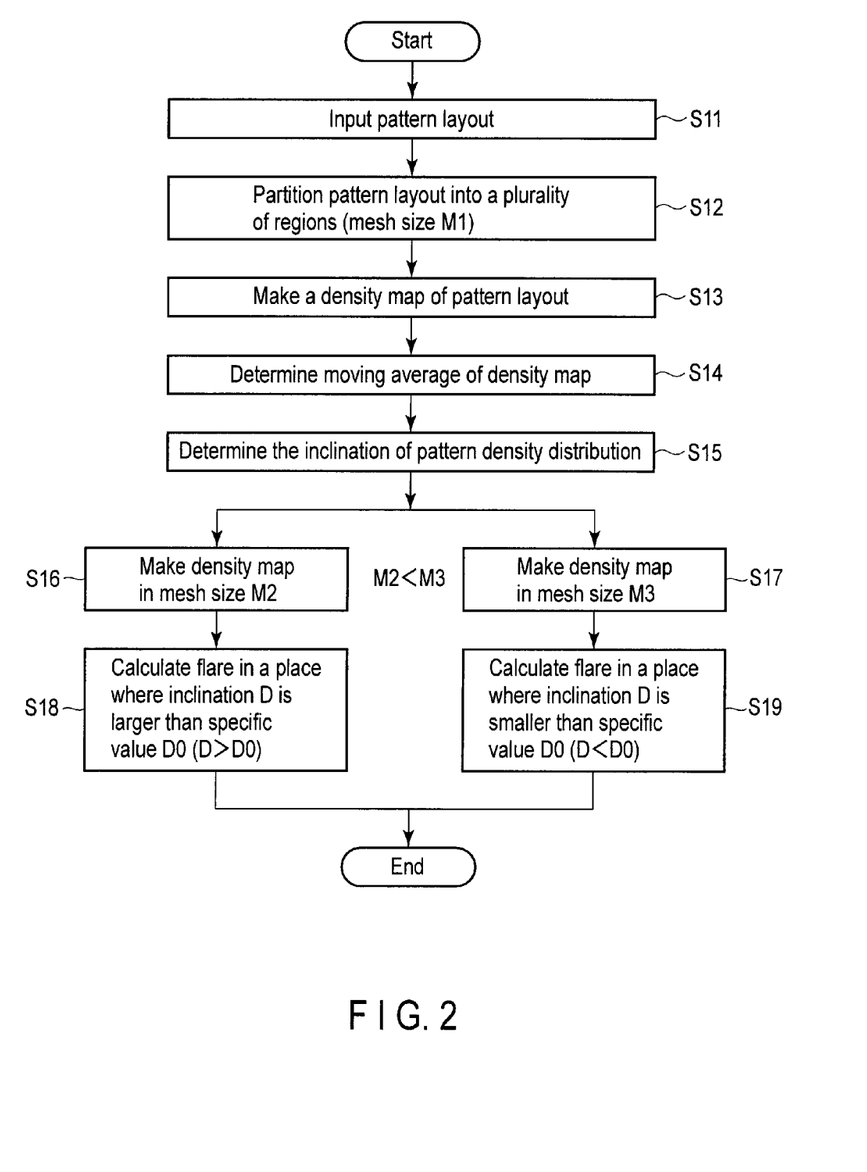
FIG. 2 is a flowchart to explain the flare prediction method according to the embodiment.

FIG. 2 is a flowchart to explain the flare prediction method according to the embodiment. Hereinafter, unless otherwise stated, the method is executed by the computer 10. Furthermore, unless otherwise stated, the result obtained in each step is stored in the storage unit 20.

Figure 3:
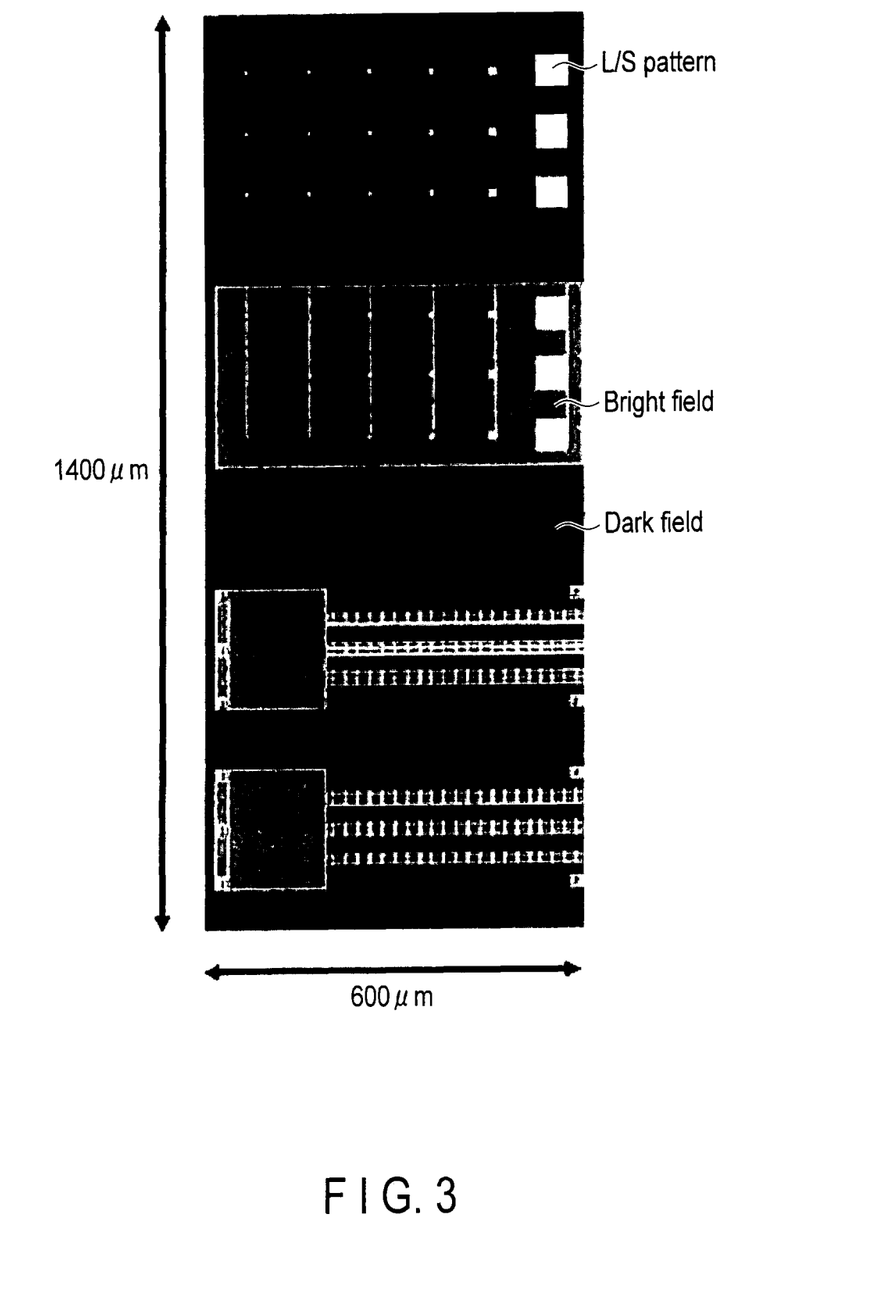
FIG. 3 shows a pattern layout in the embodiment.

First, a pattern layout (or design layout) of a semiconductor device generated by the pattern layout generator 30 is input to the computer 10 (S11). In this step, a layout as shown in FIG. 3 is used as the pattern layout.

Next, the pattern layout is partitioned into a plurality of regions (S12). In this embodiment, the size (or mesh size M1) of each of the partitioned regions is set to 0.125 μm×0.125 μm.

Next, a pattern density is determined for each of the partitioned regions (or for each mesh) to make a density map for the pattern layout (S13). The pattern density is the proportion of an area occupied by a reflection region pattern (or reflection pattern) in the partitioned regions on a reflective photomask.

Next, a moving average of the density map is determined (S14). That is, an average value is determined, while a range to be averaged is being moved. Specifically, pattern densities of the individual regions partitioned in step S12 including surrounding regions are averaged and a density distribution of averaged pattern densities are determined. Hereinafter, this moving average process will be explained with reference to FIGS. 4A to 4D.

Figure 4A:
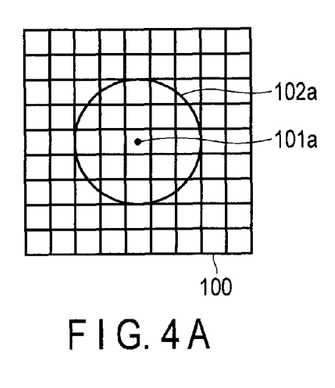
FIGS. 4A, 4B, 4C and 4D are diagrams to explain a moving average process in the embodiment.

First, as shown in FIG. 4A, a circular region 102a with a radius of R is defined, centering on an observation point (or observation mesh) 101a in a density map 100.

Figure 4B:
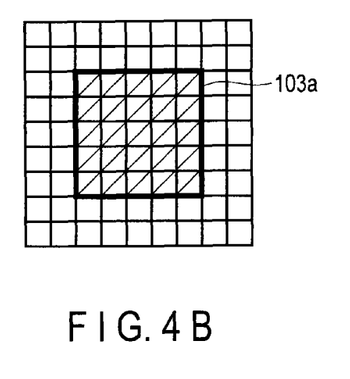

Next, as shown in FIG. 4B, all the meshes at least a part of each of which is included in the circular region 102a are extracted. Let the extracted regions be a computational region 103a. The pattern densities of meshes included in the computational region 103a are averaged. In this case, a simple average of the pattern densities of meshes included in the computational region 103a is calculated. A weighted average may be calculated by making weight greater as the distance between a mesh and the observation point 101a is shorter.

Figure 4C:
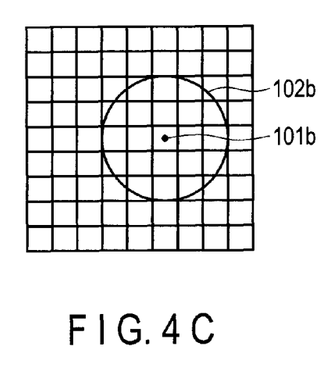

Next, as shown in FIG. 4C, the position of the observation point is shifted right by one mesh and an observation point (or observation mesh) 101b is defined. Then, a circular region 102b with a radius of R is defined, centering on the observation point 101b.

Figure 4D:
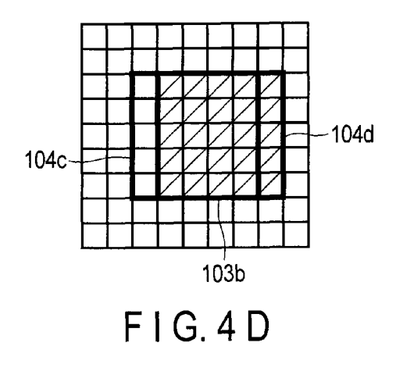

Next, as shown in FIG. 4D, all the meshes at least a part of each of which is included in the circular region 102b are extracted. Let the extracted regions be a computational region 103b. Then, the pattern densities of meshes included in the computational region 103b are averaged. The averaging process is carried out as follows. Suppose the total value of pattern densities in the computational region 103a obtained in the process of FIG. 4B is Ta and the total value of pattern densities in the computational region 103b obtained in this process is Tb. In addition, suppose a region included in the computational region 103a defined in the process of FIG. 4B and not included in the computational region 103b defined in this process is 104c and a region not included in the computational region 103a defined in the process of FIG. 4B and included in the computational region 103b defined in this process is 104d. Then, suppose the total value of pattern densities in the region 104c is Tc and the total value of pattern densities in the region 104d is Td. The total value Tb of pattern densities in the computational region 103b obtained in this process is as follows:

$$Tb = Ta - Tc + Td.$$

The total value Tb determined as described above is averaged. In the example of FIG. 4, since the number of meshes in the computational region 103b is 25, the average value is Tb/25. Doing such calculations enables the computation time of the averaging process to be shortened.

The averaging process is performed sequentially for all of the meshes, executing a moving average process, which determines a pattern density distribution on the basis of a moving average. The pattern density distribution is obtained by dividing a layout into meshes of a specific size and determining, for each of the meshes, an occupied ratio (or area) of patterns in a specific range from the center position of the mesh region.

Next, the inclination of the pattern density distribution (or pattern density distribution based on a moving average) obtained in step S14 is determined for each mesh (S15). Specifically, differential processing is performed using the following calculating formula:

$$\text{Delta}(x, y) = \frac{\sqrt{(A(x+1, y) - A(x, y))^2 + (A(x, y+1) - A(x, y))^2}}{MS}$$

where x, y are an index number in the x direction and an index number in the y direction respectively, A(x, y) is a moving average value in a mesh position (x, y), Delta (x, y) is the inclination of a moving average value (or the inclination of a pattern density distribution) in the mesh position (x, y), and MS is a mesh size (or the length of one side of a mesh).

Differential processing to determine the inclination is performed for each mesh to obtain a differential map (or an inclination map).

Next, the pattern layout is partitioned into a plurality of regions. A pattern density is determined for each of the partitioned regions (or for each mesh) to make a density map of the pattern layout (S16). Suppose the mesh size of each of the partitioned regions is M2. The mesh size M2 may be the same as or differ from the mesh size M1 of each of the regions partitioned in step S12.

Then, a density map of the pattern layout is made in mesh size M3 larger than mesh size M2 (S17). The process in step 17 may be carried out before or after the process in step S16.

Next, a flare calculation is done in a plurality of partition sizes on the basis of the inclination of a pattern density distribution (or the inclination of a pattern density distribution curve) obtained in step S15. The flare calculation is done in such a manner that the partition size is made smaller as the inclination of the pattern density distribution is greater. Hereinafter, a concrete computation method will be explained.

In a place (or mesh position) where the differential value D (or the inclination of the pattern density distribution) obtained in step S15 is larger than a specific value D0, a flare calculation is done in mesh size M2 determined in step S16 (S18). In a place (or mesh position) where the differential value D (or the inclination of the pattern density distribution) obtained in step S15 is smaller than the specific value D0, a flare calculation is done in mesh size M3 determined in step S17 (S19).

Figure 5:
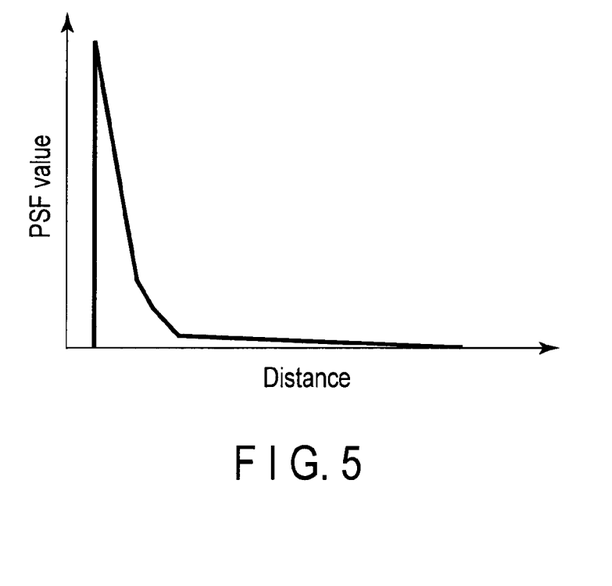
FIG. 5 is a diagram to explain PSF.

Here, a flare calculation will be explained. A flare calculation is generally done by a convolution of a function called a point spread function (PSF) that tends to have a smaller value as the distance from the observation point is larger and the pattern density distribution of the pattern layout. As the function, a PSF as shown in FIG. 5 is used.

Specifically, a flare calculation is done using the following calculating formula:

$$\text{Flare}(x, y) = \sum_X \sum_Y \left( D(X, Y) * PSF\left(\sqrt{(X-x)^2 + (Y-y)^2}\right) * MA \right)$$

where x, y are an index number in the x direction and an index number in the y direction respectively, D(x, y) is a pattern density in the mesh position (x, y), PSF(dist) is a function for determining a PSF value at an inter-mesh distance dist, Flare (x, y) is a flare value in mesh position (x, y), and MA is a mesh area.

In step S18, a flare calculation is made using the above equation for each of the regions into which the pattern layout has been partitioned in mesh size M2. At that time, only flare Flare (x, y) for a (x, y) position where inclination D is larger than D0 is calculated. In step S19, a flare calculation is done using the above equation for each of the regions into which the pattern layout has been partitioned in mesh size M3 (M3>M2). At that time, only flare Flare (x, y) for a (x, y) position where inclination D is smaller than D0 is calculated. In a place where D is equal to D0 (or under condition of D=D0), calculations may be made in either S18 or S19. Then, the flare calculation result obtained in step S18 is combined with the flare calculation result obtained in step S19, producing a flare map for the entire pattern layout.

Use of the aforementioned method enables a high-accuracy flare calculation to be made in a shorter time. Hereinafter, this will be explained further.

As described above, only one flare value is obtained for one mesh in a flare calculation. Therefore, when there is a large variation in the flare value in one mesh, a flare distribution cannot be obtained with high accuracy. To obtain a flare distribution with high accuracy, it is necessary to make the mesh size smaller to suppress a variation in the flare value in the mesh. Making the mesh size smaller leads to a significant increase in the computation time.

In addition, a place where a flare value must be determined with high accuracy is where the flare value changes greatly. Therefore, even if the mesh size for a flare calculation is made smaller in a place where the flare value changes greatly and the mesh size for a flare calculation is made larger in a place where the flare value changes slightly, a virtual accuracy of a flare distribution will not decrease. However, if a flare calculation is made to check a variation in the flare value, this will not help shorten the computation time.

Figure 6:
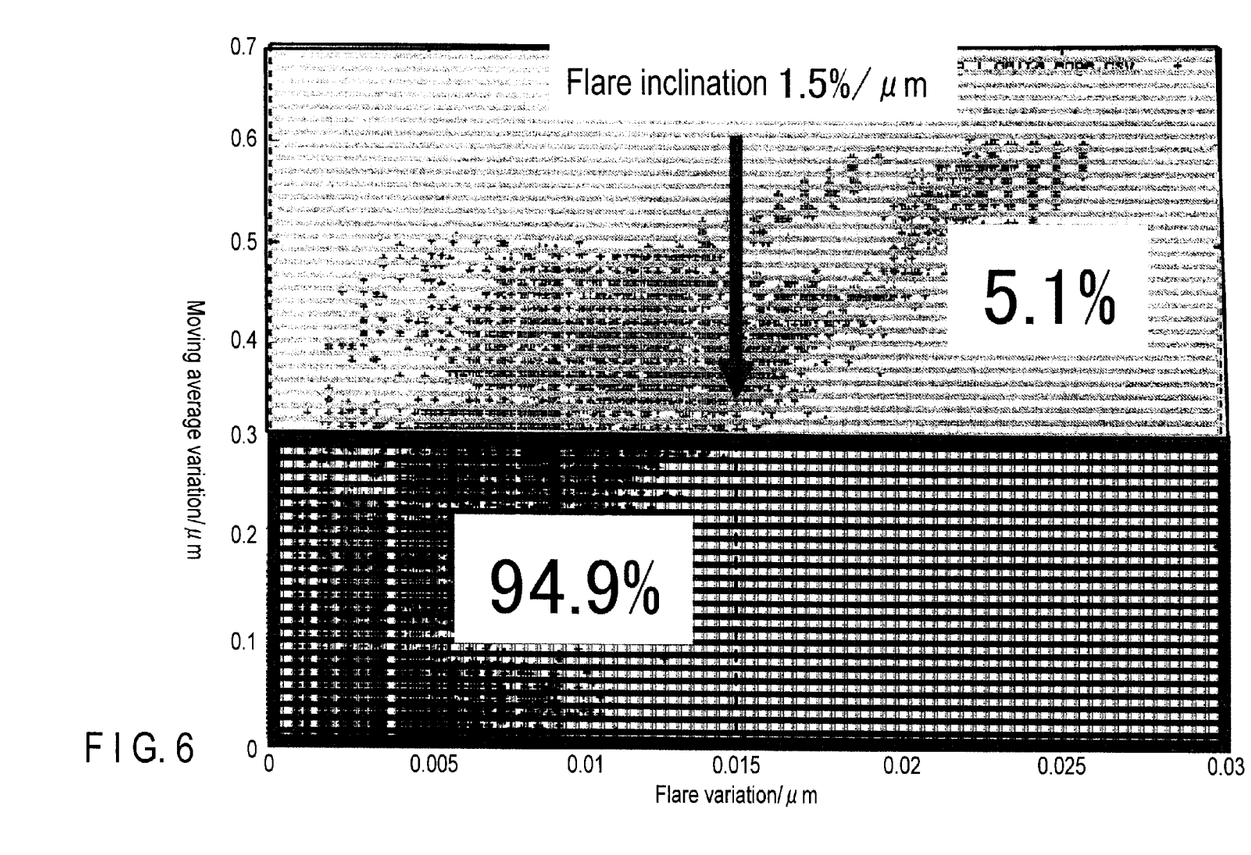
FIG. 6 shows the relationship between a flare variation and a moving average variation.

Therefore, in the embodiment, a variation in the pattern density of the pattern layout is checked in place of a variation in the flare value, thereby shortening the computation time. Specifically, as shown in FIG. 6, there is a strong correlation between a variation in the flare value and a variation in the pattern density of the pattern layout. In a region where a variation in the pattern density is large, a variation in the flare value is also large. In the embodiment, making use of this correlation, the inclination of the pattern density distribution is determined in step S15. The mesh size of a flare calculation is made small where the inclination is large. The mesh size of a flare calculation is made large where the inclination is small.

In addition, a flare calculation is done by the convolution of the pattern density distribution and PSF shown in FIG. 5. This means that the calculation can be regarded as the process of averaging surrounding pattern densities. Moreover, it is seen that flare at a short distance has a great effect and flare at a long distance has a small effect. Therefore, in the embodiment, a moving average process capable of doing calculations in a specific range in a short time is used to substitute for flare calculations. Then, a variation in the pattern density of the pattern layout is checked in place of a variation in the flare value.

Here, the effect of shortening the computation time will be explained.

The correlation between the inclination of the flare value determined by the convolution of the pattern density distribution and PSF and the inclination determined from the moving average of the pattern density was checked. The mesh size was divided into halves with the inclination of (or a variation in) the flare value being 1.5%/μm as a boundary value. On this assumption, it was seen that flare calculations were done in a small mesh size for 5.1% of the entire region and in a large mesh size for the remaining 94.9%, obtaining a high-accuracy flare calculation result.

The effect of shortening the computation time was estimated concretely. Both mesh sizes M1 and M2 were set to 0.125 μm and M3 was set to 1 μm. The size of the pattern layout was set to 600 μm×1400 μm. The radius R of the circular region shown in FIG. 4 was set to 1 μm. At this time, when the moving average map calculation amount in mesh size M1 was CM1, the flare map calculation amount in mesh size M2 was CM2, and the flare map calculation amount in mesh size M3 was CM3, the total calculation amount was (CM1+CM2+CM3). As a result, when the method of the embodiment was used, the calculation amount was $1.5\times10^{14}$ times. When all of the flare calculations were done in mesh size M2, the calculation amount was $2.9\times10^{15}$ times. Use of the method of this embodiment enables the calculation amount (calculation time) to be decreased to 5.1%.

As described above, with the embodiment, the inclination of the pattern density distribution of the pattern layout is determined and flare calculation are done in a plurality of partition sizes based on the inclination of the pattern density distribution, which enables a high-accuracy flare calculation to be done in a short time. In addition, a pattern density distribution is determined by a moving average process, which enables the computation time to be shortened remarkably.

While in the embodiment, two types of mesh size for flare calculations, M2 and M3, have been used, the number of mesh sizes may be three or more. In this case, too, the same effect as described above can be obtained.

While in the embodiment, EUV light has been used as exposure light, a reflecting optical system as the optical system, and a reflective photomask as the photomask, the embodiment is not limited to these. For instance, when a transmitting optical system is used as the optical system and a transmissive photomask is used as the photomask, the method of the embodiment may be applied.

Figure 7:
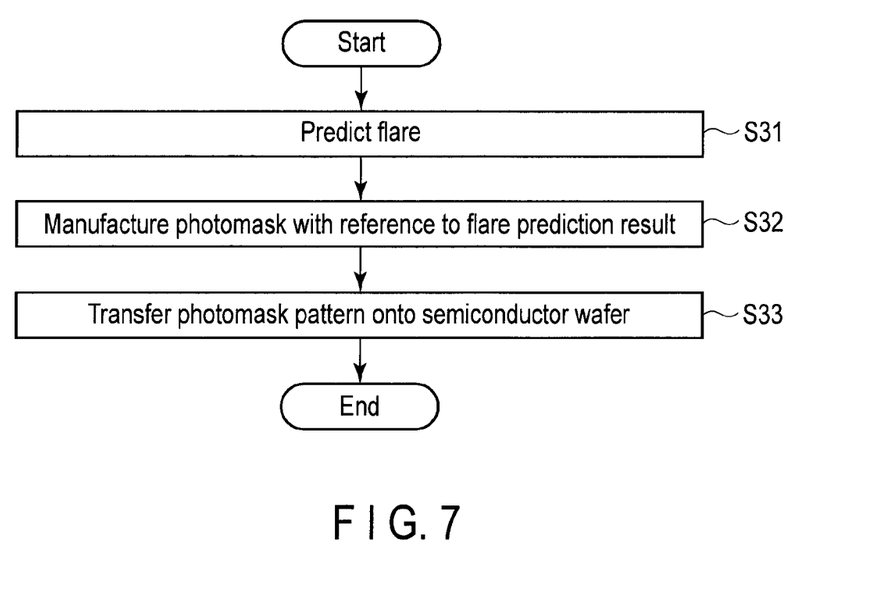
FIG. 7 is a flowchart to explain a photomask manufacturing method and a semiconductor device manufacturing method according to the embodiment.

The method described in the embodiment may be applied to a photomask manufacturing method and a semiconductor device manufacturing method. FIG. 7 is a flowchart to explain a photomask manufacturing method and a semiconductor device manufacturing method.

First, flare is predicted in photolithography by the aforementioned method (S31). Next, a photomask is manufactured with reference to the flare prediction result (S32). Specifically, a pattern layout is corrected and checked on the basis of the flare prediction result, thereby forming a photomask. Next, the pattern of the formed photomask is transferred onto a semiconductor wafer, manufacturing a semiconductor device (S33).

The method described in the embodiment can be realized by a computer whose operation is controlled by a program in which the procedure of the method has been written. The program can be offered via a recording medium, such as a magnetic disk, or a communication line (wired line or wireless circuit), such as the Internet. Specifically, the procedure based on the desired processes in the method of the embodiment or on a combination of the desired processes can be written in the form of a program.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flare prediction method in photolithography comprising:
    determining a pattern density distribution of a pattern layout;
    determining an inclination of a variation in the pattern density distribution; and
    performing a flare calculation in a plurality of partition sizes based on the inclination of a variation in the pattern density distribution.

2. The method of claim 1, wherein the flare calculation is performed in such a manner that the partition sizes are made larger in a region where the inclination of a variation in the pattern density distribution is smaller.

3. The method of claim 1, wherein the flare calculation is performed by convolving the pattern density distribution of the pattern layout with a function that tends to have a smaller value as a distance from an observation point increases.

4. The method of claim 3, wherein the function is a point spread function (PSF) of flare.

5. The method of claim 1, wherein the pattern density distribution is determined by a moving average process.

6. The method of claim 1, wherein each partition region where the flare calculation is performed is square.

7. The method of claim 1, wherein determining the pattern density distribution of the pattern layout includes partitioning the pattern layout into a plurality of regions, and determining a pattern density for each of the partitioned regions.

8. The method of claim 1, wherein exposure light used in the photolithography is EUV light.

9. The method of claim 1, wherein an optical system used in the photolithography is a reflecting optical system.

10. The method of claim 1, wherein a photomask used in the photolithography is a reflective photomask.

11. A computer-readable medium configured to store program instructions to predict flare amount in photolithography, the program instructions causing a computer to perform:

determining a pattern density distribution of a pattern layout;

determining an inclination of a variation in the pattern density distribution; and performing a flare calculation in a plurality of partition sizes based on the inclination of a variation in the pattern density distribution.

\* \* \* \* \*